(12) United States Patent
Fuketa et al.

(10) Patent No.: US 9,276,589 B2
(45) Date of Patent: Mar. 1, 2016

(54) SIGNAL TRANSMISSION CIRCUIT

(71) Applicant: Renesas Electronics Corporation, Kawasaka-shi, Kanagawa (JP)

(72) Inventors: Hiroshi Fuketa, Tokyo (JP); Makoto Takamiya, Tokyo (JP); Takayasu Sakurai, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 246 days.

(21) Appl. No.: 14/022,202

(22) Filed: Sep. 9, 2013

(65) Prior Publication Data
US 2014/0070858 A1 Mar. 13, 2014

(30) Foreign Application Priority Data
Sep. 10, 2012 (JP) ................. 2012-198259

(51) Int. Cl.
*H03L 7/06* (2006.01)
*H03L 7/08* (2006.01)
*H03K 3/0231* (2006.01)

(52) U.S. Cl.
CPC ............ *H03L 7/0802* (2013.01); *H03K 3/0231* (2013.01)

(58) Field of Classification Search
CPC ...................................... H03L 7/0891
USPC ........................................... 327/156
See application file for complete search history.

(56) References Cited

U.S. PATENT DOCUMENTS 6,538,499 B1 * 3/2003 Lu ................................. 327/557

OTHER PUBLICATIONS

Chan, Steven C., et al., "A Resonant Global Clock Distribution for the Cell Broadband Engine Processor, IEEE Journal of Solid-State Circuits", vol. 44, No. 1, Jan. 2009, pp. 64-72.

* cited by examiner

*Primary Examiner* — Daniel Puentes
(74) *Attorney, Agent, or Firm* — Shapiro, Gabor and Rosenberger, PLLC

(57) ABSTRACT

A clock generation circuit 10 includes a resonant reactor connected with a half voltage supply point TV1, a resonant capacitor CL connected between a ground voltage supply point TVss and an output terminal TVout, a transistor MP connected between the resonant reactor Lr and the resonant capacitor CL, and a transistor MN1 connected with the output terminal TVout. In this configuration, signals in a wide range of frequencies can be output with low power consumption by adjusting the time when a clock signal φ1 applied to the gates of the transistors MP1 and MN1 is high.

7 Claims, 4 Drawing Sheets

SIGNAL TRANSMISSION CIRCUIT

BACKGROUND OF THE INVENTION

1. Field of the Invention

The present invention relates to a signal transmission circuit.

2. Description of the Prior Art

One proposed configuration of a signal transmission circuit includes: an inductor having one end connected with a clock tree and the other end connected with a power source vdd via a capacitor; and the capacitor having one end connected with the other end of the inductor and the other end grounded (see, for example, Non-Patent Literature 1). This proposed circuit configuration transmits a signal by taking advantage of resonance in an LC resonant circuit consisting of the inductor and the capacitor and is thus expected to reduce the power consumption.

Non-Patent Literature 1: Steven C. Chan, et al., "A Resonant Global Clock Distribution for the Cell Broadband Engine Processor", IEEE JOURNAL OF SOLID-STATE CIRCUITS, VOL. 44, No. 1, p. 64-p. 72. JANUARY 2009

In general, the signal transmission circuit is required to output signals adequately in a wide range of frequency domain with low power consumption. In the proposed signal transmission circuit described above, however, input of a signal having a lower frequency than a resonant frequency may increase the power consumption or may cause an inappropriate operation.

SUMMARY OF THE INVENTION

The signal transmission circuit according to the invention aims to output signals in a wider range of frequencies with low power consumption.

The signal transmission circuit of the invention employs the following configuration to achieve the above object.

According to one aspect, the present invention is directed to a signal transmission circuit including a resonant reactor connected with a first voltage supply point, which a first voltage is supplied to; a resonant capacitor connected between a second voltage supply point, which a second voltage is supplied to, and an output terminal; a first switching element connected between the resonant reactor and the output terminal and configured to be turned on and off by a first switching signal; and a second switching element connected between the output terminal and the second voltage supply point and configured to be turned on and off by a second switching signal.

In the signal transmission circuit according to the present invention, when the first switching element is turned on by the first switching signal and the second switching element is turned off by the second switching signal, the voltage of the output terminal is varied in a pulse-like manner by the resonance between the resonant reactor and the resonant capacitor. At the timing when the voltage of the output terminal becomes close to the second voltage, the first switching element is turned off by the first switching signal, and the second switching element is turned on by the second switching signal. This configuration causes the voltage of the output terminal to be maintained at the voltage close to the second voltage. This enables a pulse-like signal to be output from the output terminal. In this state, the pulse-like signal of any arbitrary period that is longer than the resonant period of the resonant reactor and the resonant capacitor can be output from the output terminal by adjusting the time when the first switching element is turned off by the first switching signal and the time when the second switching element is turned on by the second switching signal. This enables signals in a wider range of frequencies to be output adequately. The power consumption can be reduced by taking advantage of the resonance between the resonant reactor and the resonant capacitor. This enables signals in a wide range of frequencies to be output with low power consumption.

In the signal transmission circuit of the invention having the above configuration, the first switching signal and the second switching signal may respectively be control signals configured to periodically turn on and off the first switching element and the second switching element with elapse of time. This configuration enables a clock signal to be output from the output terminal.

The signal transmission circuit of the invention having the above configuration that the first switching signal and the second switching signal are respectively control signals configured to periodically turn on and off the first switching element and the second switching element with elapse of time may further include a timing adjustment circuit configured to store a previous voltage that is a voltage of a signal output from the output terminal in a last cycle, compare the previous voltage with a voltage of a signal output from the output terminal in a current cycle and adjust a timing of transition of the first switching signal and a timing of transition of the second switching signal, based on a result of comparison. Since there is a variation in reactance of the resonant reactor or a variation in capacitance value of the resonant capacitor due to, for example, a variation in production, it is, however, difficult to adequately specify in advance the timing when the first switching element is turned on or off by the first switching signal and the timing when the second switching element is turned on or off by the second switching signal. This configuration stores the previous voltage that is the voltage of the signal output from the output terminal in the last cycle, compares the previous voltage with the voltage of the signal output from the output terminal in the current cycle and adjusts the timing of transition of the first switching signal and the timing of transition of the second switching signal, based on the result of comparison. This accordingly enables the first switching element and the second switching element to be turned on and off at the more adequate timings.

In the signal transmission circuit of the invention having a timing adjustment circuit, the timing adjustment circuit may include a first adjustment capacitor connected with the second voltage supply point; a second adjustment capacitor connected with the second voltage supply point; a changeover switch configured to switch between a connection of the output terminal with the first adjustment capacitor and a connection of the output terminal with the second adjustment capacitor, by a first adjustment switching signal; a comparator circuit configured to compare a voltage of the first adjustment capacitor with a voltage of the second adjustment capacitor at a rise timing or a fall timing of a second adjustment switching signal and output a result of comparison; and a clock signal supply circuit configured to input a clock signal, adjust a pulse width of the input clock signal based on the result of comparison by the comparator circuit, supply the clock signal of the adjusted pulse width as the first switching signal to the first switching element, supply the clock signal of the adjusted pulse width as the second switching signal to the second switching element, supply the clock signal of the adjusted pulse width as the first adjustment switching signal to the changeover switch and supply the clock signal of the adjusted pulse width as the second adjustment switching signal to the comparator circuit.

In the signal transmission circuit of the invention having the above configuration, the first voltage is a voltage higher than the second voltage.

According to another embodiment, the signal transmission circuit of the invention may further include a third switching element connected between a third voltage supply point, which a third voltage is supplied to, and the output terminal and configured to be turned on and off by a third switching signal. In this configuration, when the first switching element and the third switching element are turned off respectively by the first switching signal and the third switching signal and the second switching signal is turned on by the second switching signal, the voltage of the output terminal becomes close to the second voltage. When the first switching element is subsequently turned on by the first switching signal and the second switching element and the third switching element are turned off respectively by the second switching signal and the third switching signal, the voltage of the output terminal is varied toward the third voltage by the resonance between the resonant reactor and the resonant capacitor. After elapse of a time that is half the resonant period between the resonant reactor and the resonant capacitor, the first switching element and the second switching element are subsequently turned off respectively by the first switching signal and the second switching signal, and the third switching element is turned on by the third switching signal. This causes the voltage of the output terminal to become close to the third voltage. After elapse of a predetermined period, the first switching element is subsequently turned on by the first switching signal, and the second switching element and the third switching element are turned off respectively by the second switching signal and the third switching signal. This causes the voltage of the output terminal to be varied toward the second voltage by the resonance between the resonant reactor and the resonant capacitor. When the first switching element and the third switching element are subsequently turned off respectively by the first switching signal and the third switching signal and the second switching element is turned on by the second switching signal, the voltage of the output terminal becomes close to the second voltage. This enables a signal of any arbitrary duty ratio to be output from the output terminal. In this state, a signal of any arbitrary period that is longer than a resonant period of the resonant reactor and the resonant capacitor can be output from the output terminal by adjusting the time when the first switching element is turned on by the first switching signal and the time when the second switching element and the third switching element are turned off respectively by the second switching signal and the third switching signal. This configuration enables signals in a wider range of frequencies to be output adequately. This configuration takes advantage of the resonance between the resonant reactor and the resonant capacitor, thus enabling reduction of the power consumption. This accordingly enables signals in a wide range of frequencies to be output more adequately with lower power consumption.

In the signal transmission circuit of the invention having a third switching element, the first switching signal, the second switching signal and the third switching signal may respectively be control signals configured to periodically turn on and off the first switching element, the second switching element and the third switching element with elapse of time. This configuration enables a clock signal to be output from the output terminal.

The signal transmission circuit of the invention having the above configuration that the first switching signal, the second switching signal and the third switching signal are respectively control signals configured to periodically turn on and off the first switching element, the second switching element and the third switching element with elapse of time may further include a timing adjustment circuit configured to store a previous voltage that is a voltage of a signal output from the output terminal in a last cycle, compare the previous voltage with a voltage of a signal output from the output terminal in a current cycle and adjust a timing of transition of the first switching signal, a timing of transition of the second switching signal and a timing of transition of the third switching signal, based on a result of comparison. Since there is a variation in reactance of the resonant reactor or a variation in capacitance value of the resonant capacitor due to, for example, a variation in production, it is, however, difficult to adequately specify in advance the timing when the first switching element is turned on or off by the first switching signal, the timing when the second switching element is turned on or off by the second switching signal and the timing when the third switching element is turned on and off by the third switching signal. This configuration stores the previous voltage that is the voltage of the signal output from the output terminal in the last cycle, compares the previous voltage with the voltage of the signal output from the output terminal in the current cycle and adjusts the timing of transition of the first switching signal, the timing of transition of the second switching signal and the timing of transition of the third switching signal, based on the result of comparison. This accordingly enables the first switching element, the second switching element and the third switching element to be turned on and off at the more adequate timings.

In the signal transmission circuit of the invention having a third switching element, the first voltage is a voltage higher than the second voltage but lower than the third voltage.

DESCRIPTION OF THE PREFERRED EMBODIMENTS

The following describes best modes of carrying out the invention with reference to embodiments.

Figure 1:
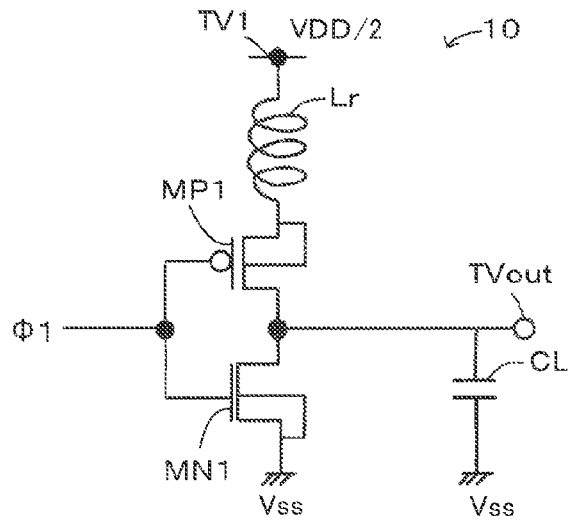
FIG. 1 is a block diagram illustrating the schematic configuration of a clock generation circuit 10 according to a first embodiment of the invention.

FIG. 1 is a block diagram illustrating the schematic configuration of a clock generation circuit 10 according to a first embodiment of the invention. As illustrated, the clock generation circuit 10 includes: a resonant reactor Lr of a reactance L connected with a half voltage supply point TV1, at which a voltage (VDD/2) that is half a power voltage VDD (for example, 1.0 V) is applied; a resonant capacitor CL of a capacitance value C connected between a ground voltage supply point TVss, at which a ground voltage Vss is supplied, and an output terminal TVout; a transistor MP1 that is a p-type MOS (Metal Oxide Semiconductor) transistor connected between the resonant reactor Lr and the resonant capacitor CL; and a transistor MN1 that is an n-type MOS transistor connected with the output terminal TVout and configured to have a gate connected with a gate of the transistor MP1. A clock signal φ1 having amplitudes of the ground voltage Vss to the power voltage VDD is applied to the gates of the transistors MP1 and MN1.

Figure 2:
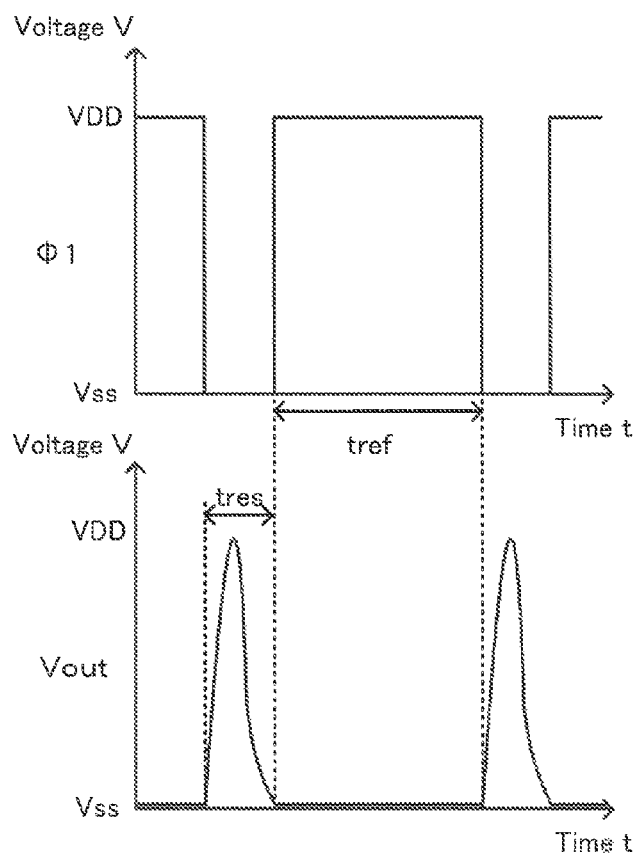
FIG. 2 is a timing chart showing one example of a relationship between clock signal $\phi 1$ and voltage Vout from the output terminal TVout.

FIG. 2 is a timing chart showing one example of a relationship between clock signal φ1 and voltage Vout from the output terminal TVout. When the clock signal φ1 becomes low (voltage Vss), the transistor MP1 is turned on and the transistor MN1 is turned off. This causes the voltage Vout of the output terminal TVout to vary in a pulse-like manner by the resonance between the resonant reactor Lr and the resonant capacitor CL. The pulse width in this state is approximately equal to a resonant period Tres (=$2\pi\cdot\sqrt{(L\cdot C)}$) of the resonant reactor Lr and the resonant capacitor CL.

When the clock signal φ1 subsequently becomes high (voltage VDD), the transistor MP1 is turned off and the transistor MN1 is turned on. This causes the voltage Vout of the output terminal TVout to be equal to the ground voltage Vss. Herein the clock signal φ1 is configured to become high at a predetermined timing when the voltage Vout of the output terminal TVout becomes close to the voltage Vss. When the clock signal φ1 becomes low (voltage Vss) again after elapse of a predetermined time tref in this state, the transistor MP1 is turned on and the transistor MN1 is turned off. This causes the voltage Vout of the output terminal TVout to vary again in a pulse-like manner. Repeating this series of operations enables a clock signal CLK to be output from the output terminal TVout.

Adjusting in advance the predetermined time tref, which is the time when the clock signal φ1 is high, enables the clock signal CLK of any arbitrary period that is longer than the resonant period Tres to be output from the output terminal TVout. This configuration enables signals in a wider range of frequencies to be output adequately. This configuration also generates the clock signal CLK by taking advantage of the resonance between the resonant reactor Lr and the resonant capacitor CL and thereby enables reduction of power consumption. The signals in a wide range of frequencies can thus be output with low power consumption.

The clock generation circuit 10 of the first embodiment described above has the resonant reactor Lr connected with the half voltage supply point TV1, the resonant capacitor CL connected between the ground voltage supply point TVss and the output terminal TVout, the transistor MP1 connected between the resonant reactor Lr and the resonant capacitor CL, and the transistor MN1 connected with the output terminal TVout. The signals in a wide range of frequencies can be output with low power consumption by adjusting the time when the clock signal φ1 applied to the gates of the transistors MP1 and MN1 is high.

Figure 3:
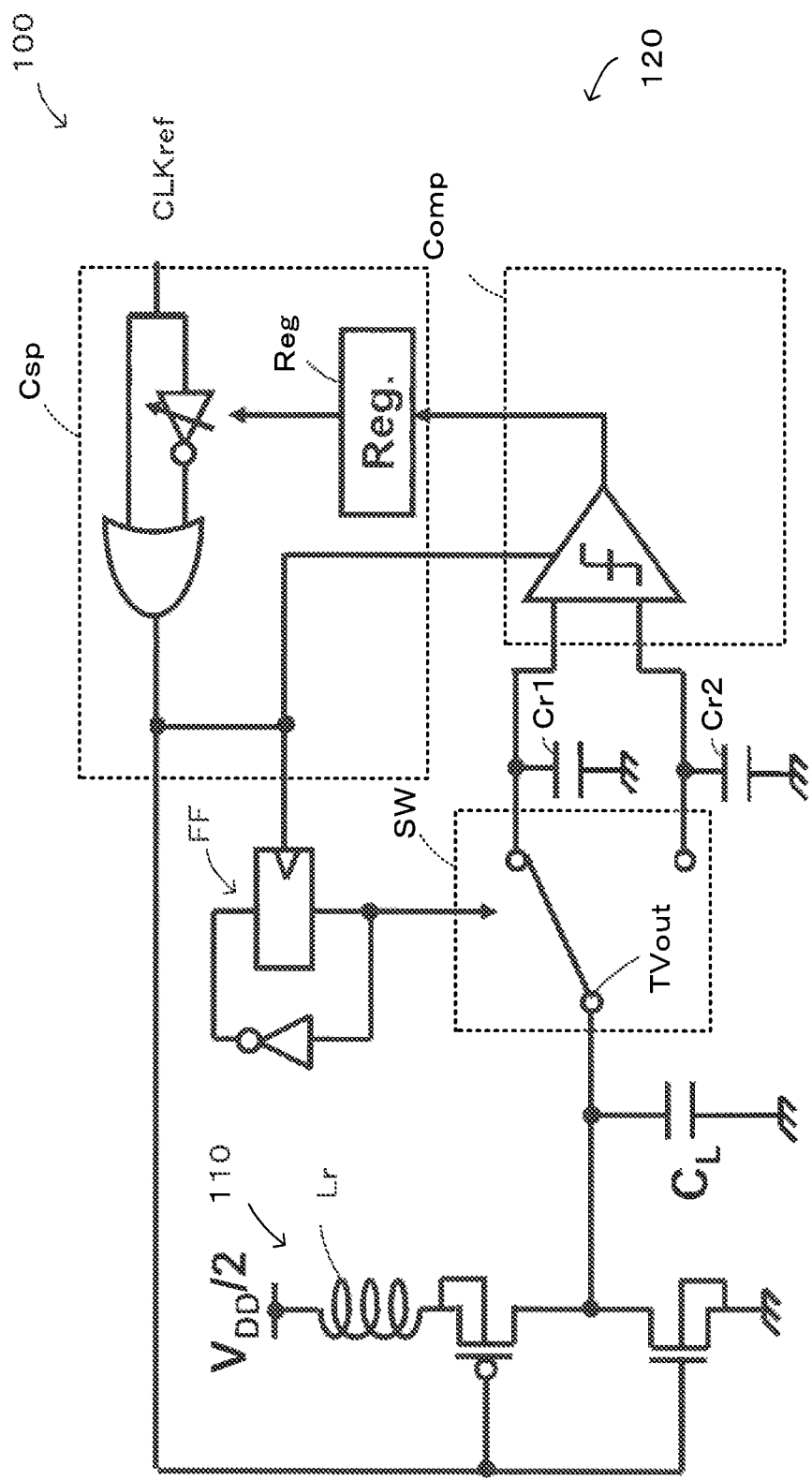
FIG. 3 is a block diagram illustrating the schematic configuration of a clock generation circuit 100 according to a second embodiment of the invention.

The clock generation circuit 10 of the first embodiment applies the clock signal φ1, for which the timing when the signal becomes high has been determined in advance, to the gates of the transistors MP1 and MN1. Since there is a variation in reactance L of the resonant reactor Lr or a variation in capacitance value C of the resonant capacitor CL due to, for example, a variation in production, it is, however, difficult to specify in advance the timing of transition of the clock signal φ1. In order to avoid such a disadvantage, a clock generation circuit 100 according to a second embodiment additionally includes a timing adjustment circuit 120 configured to adjust the timing when the clock signal φ1 becomes high. FIG. 3 is a block diagram illustrating the schematic configuration of the clock generation circuit 100 according to the second embodiment of the invention. The clock generation circuit 100 includes a clock generator 110 configured to generate a clock signal and the timing adjustment circuit 120 configured to adjust the timing when the clock signal φ1 becomes high. The configuration of the clock generator 110 is similar to the configuration of the clock generation circuit 10 according to the first embodiment. Like components are expressed by like numerals and symbols and are not specifically described here. In order to avoid repetition in description, the description is omitted here.

The timing adjustment circuit 120 includes: adjustment capacitors Cr1 and Cr2 connected with a ground voltage supply point TVss; a changeover switch SW controlled by a clock signal φ1 input via a flip flop FF to switch between the connection of the output terminal TVout with the adjustment capacitor Cr1 and the connection of the output terminal TVout with the adjustment capacitor Cr2; a comparator circuit Comp configured to compare a voltage Vcr1 of the adjustment capacitor Cr1 and a voltage Vcr2 of the adjustment capacitor Cr2 at a timing of a rise of the clock signal φ1 and output the result of the comparison; the clock generator 110 configured to receive the input of a reference clock signal CLKref and a pulse width command Pwreq based on the result of the comparison by the comparator circuit Comp and adjust the pulse width of the reference clock signal CLKref according to the pulse width command Pwreq stored in a register Reg to generate the clock signal of the adjusted pulse width as the clock signal φ1; and a clock signal supply circuit Csp configured to output the clock signals to the flip flop FF, the changeover switch SW and the comparator circuit Comp.

The comparator circuit Comp sets the voltage of one of the adjustment capacitors that is not connected with the changeover switch SW to a threshold voltage for determination, at the timing of a rise of the clock signal φ1, and determines whether the voltage of the other adjustment capacitor that is connected with the changeover switch SW is lower than the threshold voltage for determination. For example, when the changeover switch SW is connected with the adjustment capacitor Cr1 at the timing of a certain rise of the clock signal φ1, the voltage Vcr2 is set to the threshold voltage for determination. When the voltage Vcr1 is lower than the voltage Vcr2, the pulse width command Pwreq for increasing the pulse width is sent to the clock signal supply circuit Csp. When the voltage Vcr1 is not lower than the voltage Vcr2, on the other hand, the pulse width command Pwreq for decreasing the pulse width is sent to the clock signal supply circuit Csp. When the changeover switch SW is connected with the adjustment capacitor Cr2 at the timing of a subsequent rise of the clock signal φ1, the voltage Vcr1 is set to the threshold voltage for determination. When the voltage Vcr2 is lower than the voltage Vcr1, the pulse width command Pwreq for increasing the pulse width is sent to the clock signal supply circuit Csp. When the voltage Vcr2 is not lower than the voltage Vcr1, on the other hand, the pulse width command Pwreq for decreasing the pulse width is sent to the clock signal supply circuit Cap. In this way, the comparator circuit Comp sets the voltage of one of the adjustment capacitors that is not connected with the changeover switch SW to the threshold voltage for determination at the timing of a rise of the clock signal φ1 and determines whether the voltage of the other adjustment capacitor that is connected with the changeover switch SW is lower than the threshold voltage for determination.

Figure 4:
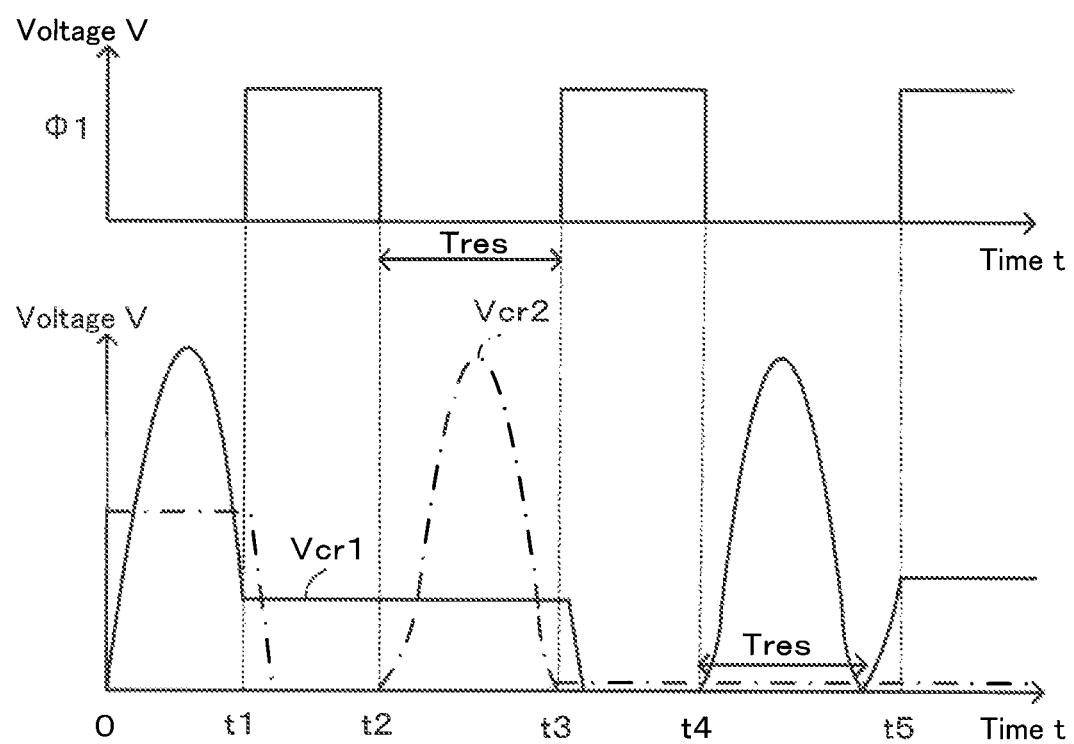
FIG. 4 is a timing chart showing one example of a relationship between clock signal $\phi 1$ and output from the comparator circuit Comp.

The following describes the operations of the clock generation circuit 100 configured as described above. FIG. 4 is a timing chart showing one example of a relationship between clock signal φ1 and output from the comparator circuit Comp. In the timing chart, the dot and dash line shows the voltage Vcr2 of the adjustment capacitor Cr2. In the initial stage, it is assumed that the output terminal TVout is connected with the adjustment capacitor Cr1 by means of the changeover switch SW. It is also assumed that the adjustment capacitor Cr1 keeps the voltage Vcr2 of the output terminal TVout at the timing of a previous rise of the clock signal φ1 in a last cycle. When the clock signal φ1 is low (time 0 to time t1), the voltage Vcr1 of the adjustment capacitor Cr1 is varied in a pulse-like manner at a resonant period Tres of the resonant reactor Lr and the resonant capacitor CL.

At the timing of a subsequent rise of the clock signal φ1 (time t1), the comparator circuit Comp sets the voltage Vcr2 to the threshold voltage for determination (previous voltage in the last cycle) and compares the voltage Vcr1 of the adjustment capacitor Cr1 with the voltage Vcr2 of the adjustment capacitor Cr2. When the voltage Vcr1 is lower than the voltage Vcr2 that is the previous voltage in the last cycle, it is thought that the timing of the rise of the clock signal φ1 is too early. In a next cycle, the clock signal supply circuit Csp adjusts the pulse width of the reference clock signal CLKref to increase the pulse width of the clock signal φ1 and outputs the clock signal of the adjusted pulse width as the clock signal φ1. Concurrently, the changeover switch SW serves to connect the output terminal TVout with the adjustment capacitor Cr2. In this state, since the output terminal TVout is connected with the adjustment capacitor Cr2 by means of the changeover switch SW, the voltage Vcr1 of the adjustment capacitor Cr1 is maintained until a subsequent switching of the changeover switch SW. Since the transistor MP1 is turned off and the transistor MN1 is turned on, the voltage Vcr2 becomes close to the voltage Vss.

When the clock signal φ1 subsequently becomes low (time t2), the transistor MP1 is turned on and the transistor MN1 is turned off. This causes the voltage Vcr2 of the adjustment capacitor Cr2 to vary in a pulse-like manner at the resonant period Tres of the resonant reactor Lr and the resonant capacitor CL.

At the timing of a subsequent rise of the clock signal φ1 (time t3), the comparator circuit Comp sets the voltage Vcr1 to the threshold voltage for determination (previous voltage in the last cycle) and compares the voltage Vcr1 of the adjustment capacitor Cr1 with the voltage Vcr2 of the adjustment capacitor Cr2. When the voltage Vcr2 is lower than the voltage Vcr1 set to the threshold voltage for determination, it is thought that the timing of the rise of the clock signal φ1 is too early. In a next cycle, the clock signal supply circuit Csp adjusts the pulse width of the reference clock signal CLKref to increase the pulse width of the clock signal φ1 and outputs the clock signal of the adjusted pulse width as the clock signal φ1. Concurrently, the changeover switch SW serves to connect the output terminal TVout with the adjustment capacitor Cr1. In this state, since the output terminal TVout is connected with the adjustment capacitor Cr1 by means of the changeover switch SW, the voltage Vcr2 of the adjustment capacitor Cr2 is maintained until a subsequent switching of the changeover switch SW. Since the transistor MP1 is turned off and the transistor MN1 is turned on, the voltage Vcr1 becomes close to the voltage Vss.

When the clock signal φ1 becomes low (time t4), the transistor MP1 is turned on and the transistor MN1 is turned off. This causes the voltage Vcr1 of the adjustment capacitor Cr1 to vary in a pulse-like manner at the resonant period Tres of the resonant reactor Lr and the resonant capacitor CL.

At the timing of a subsequent rise of the clock signal φ1 (time t5), the comparator circuit Comp sets the voltage Vcr2 to the threshold voltage for determination and compares the voltage Vcr1 of the adjustment capacitor Cr1 with the voltage Vcr2 of the adjustment capacitor Cr2. When the voltage Vcr1 is higher than the voltage Vcr2, the timing of the rise of the clock signal φ1 is too late. In a next cycle, the clock signal supply circuit Csp adjusts the pulse width of the reference clock signal CLKref to decrease the pulse width of the clock signal φ1 and outputs the clock signal of the adjusted pulse width as the clock signal φ1. Concurrently the changeover switch SW is switched. Adjusting the pulse width of the clock signal φ1 by this series of operations enables the transition timing of the clock signal φ1 to high to be adjusted to the timing of a fall of the voltage Vout of the output terminal TVout, thus ensuring output of the more appropriate clock signal CLK.

The clock generation circuit 100 of the second embodiment described above has the timing adjustment circuit 120 configured to adjust the timing when the clock signal φ1 becomes high. This configuration ensures output of the more adequate clock signal CLK even in the case of a variation in reactance L of the resonant reactor Lr or in the case of a variation in capacitance value C of the resonant capacitor CL due to, for example, a variation in production.

The clock generation circuit 100 of the second embodiment has the comparator circuit Comp having the configuration illustrated in FIG. 3. The comparator circuit Comp is, however, not limited to the configuration illustrated in FIG. 3 but may have any configuration that stores a previous voltage, which is the voltage of a signal output in the last cycle from the output terminal TVout, compares the previous voltage and the voltage of a signal output in the current cycle from the output terminal TVout and supplies the result of the comparison to the clock signal supply circuit Csp.

The clock generation circuit 100 of the second embodiment has the clock signal supply circuit Csp having the configuration illustrated in FIG. 3. The clock signal supply circuit Csp is, however, not limited to the configuration illustrated in FIG. 3 but may have any configuration that adjusts the timing of transition of the clock signal φ1 based on the result of the comparison by the comparator circuit Comp.

The clock generation circuit 10 of the first embodiment and the clock generation circuit 110 of the second embodiment are configured to supply the clock signal φ1 to the interconnected gates of the transistor MP1 and the MN1. The gates of the transistors MP1 and MN1 may, however, be interconnected, but clock signals φ1 and φ2 may be supplied individually to the respective gates of the transistors MP1 and MP2. In this case, the clock signals φ1 and φ2 may be in-phase clock signals.

Figure 5:
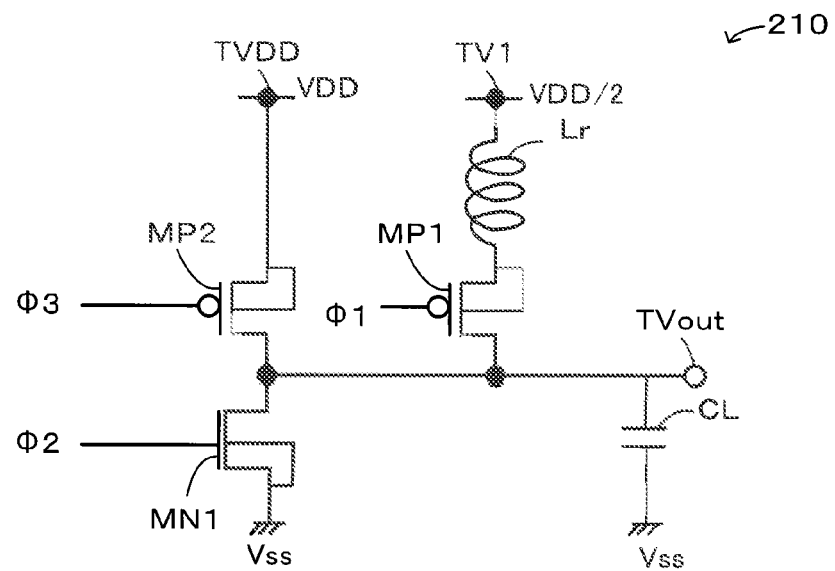
FIG. 5 is a block diagram illustrating the schematic configuration of a clock generation circuit 210 according to a third embodiment of the invention.

FIG. 5 is a block diagram illustrating the schematic configuration of a clock generation circuit 210 according to a third embodiment of the invention. As illustrated, the clock generation circuit 210 includes: a resonant reactor Lr of a reactance L connected with a half voltage supply point TV1, at which a voltage (VDD/2) that is half a power voltage VDD (for example, 1.0 V) is applied; a resonant capacitor CL of a capacitance value C connected between a ground voltage supply point TVss, at which a ground voltage Vss is supplied, and an output terminal TVout; a transistor MP1 that is a p-type MOS transistor connected between the resonant reactor Lr and the resonant capacitor CL; a transistor MN1 that is an n-type transistor connected with the output terminal TVout and configured to have a gate connected with a gate of the transistor MP1; and a transistor MP2 that is a p-type MOS transistor connected between a power voltage supply point TVDD, at which the power voltage VDD is applied, and the output terminal TVout. A clock signal ϕ1 having the amplitude of the ground voltage Vss to the power voltage VDD is applied to the gate of the transistor MP1. A clock signal ϕ2 having the amplitude of the ground voltage Vss to the power voltage VDD is applied to the gate of the transistor MN1. A clock signal ϕ3 having the amplitude of the ground voltage Vss to the power voltage VDD is applied to the gate of the transistor MP2.

Figure 6:
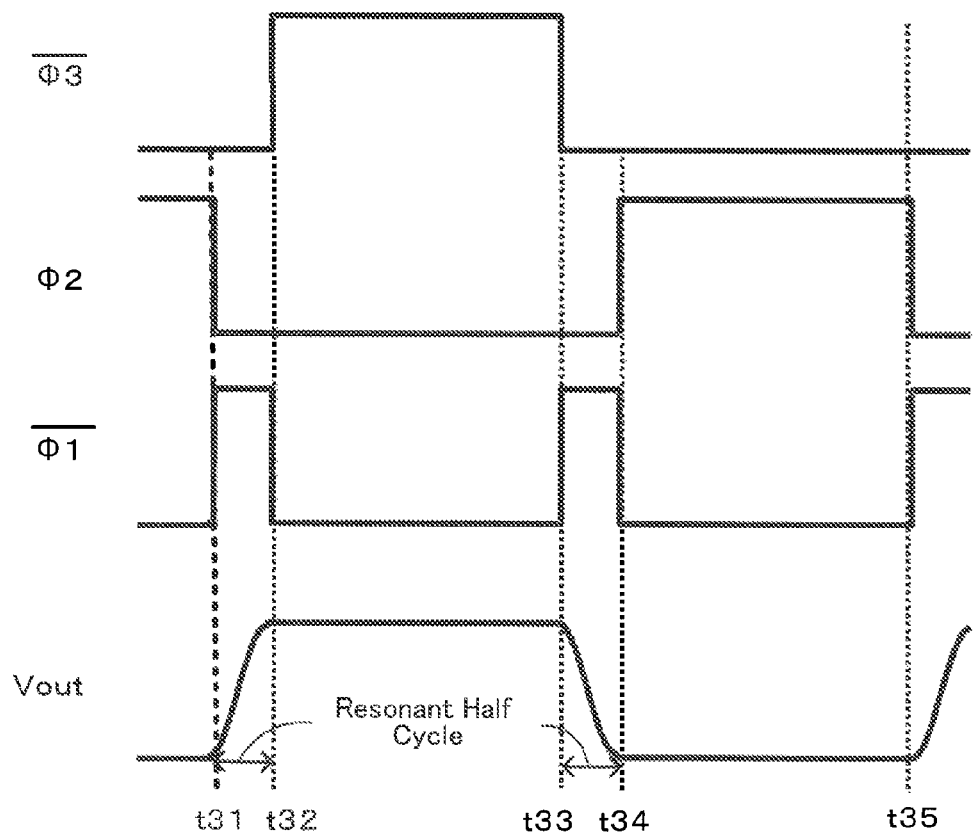
FIG. 6 is a timing chart showing one example of a relationship among clock signals $\phi 1$ to $\phi 3$ and voltage Vout from an output terminal TVout.

FIG. 6 is a timing chart showing one example of a relationship among reverse-phase signals $\overline{\phi 1}$ and $\overline{\phi 3}$ of the clock signals ϕ1 and ϕ3, the clock signal ϕ2 and the voltage Vout of the output terminal TVout. When the clock signal ϕ1 is low (voltage Vss), the clock signal ϕ2 is low, and the clock signal ϕ3 is high (voltage VDD) (time t31), the transistor MP1 is turned on, the transistor MN1 is turned off, and the transistor MP2 is turned off. This causes the voltage of the output terminal TVout to rise at a resonant half cycle (Tres/2) that is half the time of a resonant period Tres ($=2\pi \cdot \sqrt{(L \cdot C)}$) of the resonant reactor Lr and the resonant capacitor CL by the resonance between the resonant reactor Lr and the resonant capacitor CL.

At the timing of a rise of the output terminal TVout, when the clock signal ϕ1 becomes high and the clock signal ϕ3 becomes low (time t32), the transistor MP1 is turned off, the transistor MN1 is turned off, and the transistor MP2 is turned on. This causes the voltage Vout of the output terminal TVout to rise to and maintain at the voltage VDD.

At the subsequent timing of elapse of a predetermined time since the timing when the clock signal ϕ1 becomes high and the clock signal ϕ3 becomes low (time t32), when the clock signal ϕ1 becomes low, the clock signal ϕ2 becomes low and the clock signal ϕ3 becomes high (time t33), the transistor MP1 is turned on, the transistor MN1 is turned off and the transistor MP2 is turned off. This causes the voltage Vout of the output terminal TVout to fall at the resonant half cycle (Tres/2) by the resonance between the resonant reactor Lr and the resonant capacitor CL.

At the timing of a fall of the voltage Vout of the output terminal TVout to be close to the voltage Vss, when the clock signal ϕ1 becomes high and the clock signal ϕ2 becomes high (time t34), the transistor MP1 is turned off, the transistor MN1 is turned on and the transistor MP2 is turned off. This causes the voltage Vout of the output terminal TVout to be maintained at the voltage Vss. Repeating this series of operations enables a clock signal CLK to be output from the output terminal TVout.

Adjusting the time periods when the transistor MP1 alone is turned on by the clock signal ϕ1 (time period between time t32 and time t33 and time period between time t34 and time t35 in FIG. 6) enables a signal of any arbitrary period that is longer than the resonant period Tres of the resonant reactor Lr and the resonant capacitor CL to be output from the output terminal TVout. This configuration enables signals in a wider range of frequencies to be output adequately. This configuration also enables reduction of power consumption by taking advantage of the resonance between the resonant reactor Lr and the resonant capacitor CL. The signals in the wide range of frequencies can thus be output more adequately with the lower power consumption.

The clock generation circuit 210 of the third embodiment described above has the resonant reactor Lr connected with the half voltage supply point TV1, the resonant capacitor CL connected between the ground voltage supply point TVss and the output terminal TVout, the transistor MP1 connected between the resonant reactor Lr and the resonant capacitor CL, the transistor MN1 connected with the output terminal TVout and the transistor MP2 connected between the power voltage supply point TVDD and the output terminal TVout. The signals in a wide range of frequencies can be output with low power consumption by adjusting the clock signals ϕ1 to ϕ3 applied to the gates of the transistors MP1, MN1 and MP2.

In the clock generation circuits 10 and 210 of the first and the third embodiments and the clock generator 110 of the clock generation circuit 100 of the second embodiment, the MOS transistors are employed for the transistors MP1, MN1 and MP2. Any switching elements that are turned on and off by the clock signals ϕ1 to ϕ3, for example, a different type of transistors other than the MOS transistors, may be employed for these transistors MP1, MN1 and MP2. In this case, the high or the low of the respective clock signals ϕ1 to ϕ3 may be determined adequately, such that the on-off timings of the respective switching signals specify the on-off timings of the above transistors MP1, MN1 and MP2.

In the clock generation circuits 10 and 210 of the first and the third embodiments and the clock generator 110 of the clock generation circuit 100 of the second embodiment, the clock signals ϕ1 to ϕ3 have the amplitudes of the ground voltage Vss to the power voltage VDD. The clock signals ϕ1 to ϕ3 may, however, have the greater amplitudes to increase the gate widths of the transistors MP1, MN1 and MP2 and operate the transistors MP1, MN1 and MP2 in a sub-threshold range. This further reduces the power consumption.

The clock generation circuits 10 to 210 of the first to the third embodiments respectively serve to input the clock signal ϕ1 or the clock signals ϕ1 to ϕ3 and generate the clock signal CLK. Each of these clock generation circuits 10 to 210 may, however, serve as a signal transmission circuit that inputs a signal that rises and falls in a pulse-like manner instead of the clock signals ϕ1 to ϕ3 and output a reverse-phase signal or an in-phase signal.

In the clock generation circuits 10 to 210 of the first to the third embodiments, the half voltage (VDD/2) of the power voltage VDD is supplied to the half voltage supply point TV1 connected with the resonant reactor Lr. The voltage supplied to the half voltage supply point TV1 is, however, not limited to the half voltage of the power voltage VDD. For example, the power voltage VDD may alternatively be supplied to the half voltage supply point TV1.

The following describes the correspondence relation between the primary components of the embodiment and the primary components of the invention described in SUMMARY OF THE INVENTION. The resonant reactor Lr of the embodiment corresponds to the "resonant reactor" of the invention. The resonant capacitor CL corresponds to the "resonant capacitor" of the invention. The transistor MP1 corresponds to the "first transistor" of the invention. The transistor MN1 corresponds to the "second transistor" of the invention. The timing adjustment circuit 120 corresponds to the "timing adjustment circuit" of the invention. The transistor MP2 corresponds to the "third transistor" of the invention.

The foregoing has described some embodiments of the invention. The invention is, however, not limited to the above embodiments, but a multiplicity of variations and modifications may be made to the embodiments without departing from the scope of the invention.

The disclose of Japanese Patent Application No. 2012-198259 filed Sep. 10, 2012 including specification, drawings and claims is incorporated herein by reference in its entirety.

What is claimed is:

1. A signal transmission circuit, comprising:
a resonant reactor connected with a first voltage supply point, which a first voltage is supplied to;
a resonant capacitor connected between a second voltage supply point, which a second voltage is supplied to, and an output terminal;
a first switching element connected between the resonant reactor and the output terminal and configured to be turned on and off by a first switching signal; and
a second switching element connected between the output terminal and the second voltage supply point and configured to be turned on and off by a second switching signal,
wherein the first switching signal and the second switching signal are respectively control signals configured to periodically turn on and off the first switching element and the second switching element with elapse of time,
the signal transmission circuit further comprising a timing adjustment circuit configured to store a previous voltage that is a voltage of a signal output from the output terminal in a last cycle, compare the previous voltage with a voltage of a signal output from the output terminal in a current cycle and adjust a timing of transition of the first switching signal and a timing of transition of the second switching signal, based on a result of comparison.

2. The signal transmission circuit according to claim 1, wherein
the timing adjustment circuit comprises:
a first adjustment capacitor connected with the second voltage supply point;
a second adjustment capacitor connected with the second voltage supply point;
a changeover switch configured to switch between a connection of the output terminal with the first adjustment capacitor and a connection of the output terminal with the second adjustment capacitor, by a first adjustment switching signal;
a comparator circuit configured to compare a voltage of the first adjustment capacitor with a voltage of the second adjustment capacitor at a rise timing or a fall timing of a second adjustment switching signal and output a result of comparison; and
a clock signal supply circuit configured to input a clock signal, adjust a pulse width of the input clock signal based on the result of comparison by the comparator circuit, supply the clock signal of the adjusted pulse width as the first switching signal to the first switching element, supply the clock signal of the adjusted pulse width as the second switching signal to the second switching element, supply the clock signal of the adjusted pulse width as the first adjustment switching signal to the changeover switch and supply the clock signal of the adjusted pulse width as the second adjustment switching signal to the comparator circuit.

3. The signal transmission circuit according to claim 1, wherein
the first voltage is a voltage higher than the second voltage.

4. The signal transmission circuit according to claim 1, further comprising:
a third switching element connected between a third voltage supply point, which a third voltage is supplied to, and the output terminal and configured to be turned on and off by a third switching signal.

5. The signal transmission circuit according to claim 4, wherein
the first switching signal, the second switching signal and the third switching signal are respectively control signals configured to periodically turn on and off the first switching element, the second switching element and the third switching element with elapse of time.

6. A signal transmission circuit, comprising:
a resonant reactor connected with a first voltage supply point, which a first voltage is supplied to;
a resonant capacitor connected between a second voltage supply point, which a second voltage is supplied to, and an output terminal;
a first switching element connected between the resonant reactor and the output terminal and configured to be turned on and off by a first switching signal;
a second switching element connected between the output terminal and the second voltage supply point and configured to be turned on and off by a second switching signal;
a third switching element connected between a third voltage supply point, which a third voltage is supplied to, and the output terminal and configured to be turned on and off by a third switching signal,
wherein the first switching signal, the second switching signal and the third switching signal are respectively control signals configured to periodically turn on and off the first switching element, the second switching element and the third switching element with elapse of time,
the signal transmission circuit further comprising a timing adjustment circuit configured to store a previous voltage that is a voltage of a signal output from the output terminal in a last cycle, compare the previous voltage with a voltage of a signal output from the output terminal in a current cycle and adjust a timing of transition of the first switching signal, a timing of transition of the second switching signal and a timing of transition of the third switching signal, based on a result of comparison.

7. The signal transmission circuit according to claim 4, wherein
the first voltage is a voltage higher than the second voltage but lower than the third voltage.

* * * * *